United States Patent [19]
Sato et al.

[11] Patent Number: 5,789,136
[45] Date of Patent: Aug. 4, 1998

[54] NEGATIVE-WORKING PHOTORESIST COMPOSITION

[75] Inventors: Mitsuru Sato; Katsumi Oomori, both of Yokohama; Kiyoshi Ishikawa, Kanagawa-ken; Etsuko Iguchi, Machida; Fumitake Kaneko, Hiratsuka, all of Japan

[73] Assignee: Tokyo Ohka Kogyo Co., Ltd., Japan

[21] Appl. No.: 626,147

[22] Filed: Apr. 5, 1996

[30] Foreign Application Priority Data

Apr. 19, 1995 [JP] Japan .................... 7-093973

[51] Int. Cl.⁶ .................. G03F 7/038; G03C 1/73
[52] U.S. Cl. .................. 430/270.1; 430/170; 430/920; 430/921; 430/925; 430/927; 522/31; 522/63; 522/67
[58] Field of Search .................. 430/270.1, 192, 430/921, 176, 919, 191, 925, 170, 920, 927; 522/31, 63, 67

[56] References Cited

U.S. PATENT DOCUMENTS

| | | | |
|---|---|---|---|
| 5,034,304 | 7/1991 | Feely | 430/192 |
| 5,118,582 | 6/1992 | Ueno et al. | 430/270.1 |
| 5,204,225 | 4/1993 | Feely . | |
| 5,227,276 | 7/1993 | Roeschert et al. | 430/270.1 |
| 5,230,985 | 7/1993 | Lohaus et al. | 430/270.1 |
| 5,256,522 | 10/1993 | Spak et al. | 430/193 |
| 5,298,364 | 3/1994 | Pawlowski et al. | 430/270.1 |
| 5,340,697 | 8/1994 | Yoshimoto et al. | 430/270.1 |
| 5,376,504 | 12/1994 | Graziano et al. | 430/270.1 |
| 5,397,685 | 3/1995 | Daniels et al. | 430/280.1 |
| 5,529,885 | 6/1996 | Ochiai et al. | 430/270.1 |

FOREIGN PATENT DOCUMENTS

| | | |
|---|---|---|
| 0 407 086 | 1/1991 | European Pat. Off. . |
| 5-45879 | 2/1993 | Japan . |
| 5-181277 | 7/1993 | Japan . |

Primary Examiner—John S. Chu
Attorney, Agent, or Firm—Wenderoth, Lind & Ponack, L.L.P.

[57] ABSTRACT

Proposed is an alkali-developable negative-working photoresist composition in the form of a solution capable of exhibiting high sensitivity and greatly improved stability of the resist layer of the composition on a substrate surface after pattern-wise exposure to actinic rays and kept for a substantial length of time before further processing. The photoresist composition comprises, as the essential ingredients, (a) an alkali-soluble resin such as a copolymer of hydroxystyrene and styrene; (b) a compound capable of releasing an acid when irradiated with actinic rays such as tris(2,3-dibromopropyl) isocyanurate; (c) a crosslinking agent selected from the group consisting of melamine resins and urea resins substituted at the N-positions by methylol groups, alkoxy methyl groups or a combination thereof; and (d) a sensitivity improver which is hexa(methoxymethyl) melamine or di(methoxymethyl) urea, each in a specified proportion.

9 Claims, No Drawings

NEGATIVE-WORKING PHOTORESIST COMPOSITION

BACKGROUND OF THE INVENTION

The present invention relates to a negative-working photoresist composition or, more particularly, to a negative-working photoresist composition suitable for use in the photolithographic patterning works in the manufacture of various kinds of semiconductor devices and liquid crystal display panels, which is developable with an alkaline developer solution and capable of exhibiting a high sensitivity to actinic rays and excellent stability of the resist layer on the substrate surface after pattern-wise exposure to actinic rays.

Photoresist compositions currently under use for the photolithographic patterning works in the manufacture of electronic devices are classified into positive-working photoresist compositions, of which the resist layer on the substrate surface is imparted with increased solubility in a developer solution so that the development treatment of the resist layer after pattern-wise exposure to actinic rays gives a patterned resist layer by dissolving the resist layer in the exposed areas and leaving the resist layer in the unexposed areas, and negative-working photoresist compositions, of which the patterned resist layer is formed by the resist layer left undissolved in the areas pattern-wise exposed to actinic rays. As a class of the negative-working photoresist compositions, so-called chemical-sensitization type negative-working photoresist compositions are known comprising an alkali-soluble resin, a compound capable of releasing an acid by the irradiation with actinic rays and a crosslinking agent as is disclosed, for example, in Japanese Patent Kokai 62-164045.

The pattern-wise image formation in the chemical-sensitization type negative-working photoresist composition is accomplished by utilizing the catalytic activity of the acid to give advantages that the sensitivity of the photoresist composition to the actinic rays is generally high and a patterned resist layer of high resolution can be obtained by the development treatment with an alkaline developer solution so that the photoresist compositions of this type are widely used in the manufacture of semiconductor devices and liquid crystal display panels in which extreme fineness of patterning is essential. Along with the trend in recent years in the electronic technology toward more and more compact designs of electronic instruments and higher and higher degrees of integration in semiconductor devices, photoresist compositions are also required to be further improved relative to the sensitivity to actinic rays and resolution in fine patterning.

While conventional chemical-sensitization type negative-working photoresist compositions contain, as the crosslinking agent, a melamine resin or urea resin after methylolation or alkoxymethylation, various proposals and attempts have been made heretofore for the improvement of the crosslinking agent of this type. For example, Japanese Patent Kokai 5-181277 discloses a method for the improvement of the resolution of a photoresist composition of the above mentioned type by the use of a melamine resin in which the content of residual monomer does not exceed 20% by weight. Further, Japanese Patent Kokai 3-75652 teaches that the storage stability of the photoresist composition of the above mentioned type can be improved by the use of a melamine resin containing a decreased amount of melamine oligomers including the dimer to tetramer. These prior art methods, however, are not so effective as to satisfy the requirements for the sensitivity and resolution of the photoresist compositions.

SUMMARY OF THE INVENTION

The present invention accordingly has an object, in view of the above described problems and disadvantages in the prior art, to provide a novel and improved chemical-sensitization type negative-working photoresist composition capable of exhibiting further improved sensitivity and resolution of patterning and imparted with stability of the resist layer on the substrate surface after pattern-wise exposure to actinic rays, referred to as the post-exposure stability hereinafter.

Thus, the negative-working photoresist composition provided by the present invention is a uniform blend which comprises:

(a) 100 parts by weight of an alkali-soluble resin;

(b) from 0.5 to 20 parts by weight of a compound capable of releasing an acid when irradiated with actinic rays;

(c) from 3 to 70 parts by weight of a crosslinking agent selected from the group consisting of melamine resins and urea resins substituted at the N-positions by methylol groups, alkoxy methyl groups or a combination thereof; and (d) a sensitivity improver selected from the group consisting of hexa(methoxymethyl) melamine and di(methoxymethyl) urea in an amount in the range from 5 to 40% by weight based on the amount of the component (c).

In particular, it is preferable that the component (b) is a halogen-containing triazine compound such as tris(2, 3dibromopropyl) isocyanurate. Further, it is preferable that the component (c) is a combination of a melamine resin and a urea resin each substituted at the N-positions by methylol groups and/or alkoxy methyl groups in a specified proportion and the component (d) is a combination of hexa (methoxymethyl) melamine and di(methoxymethyl) urea in a specified proportion.

DETAILED DESCRIPTION OF THE PREFERRED EMBODIMENTS

As is described above, the inventive negative-working photoresist composition comprises the components (a), (b), (c) and (d) as the essential ingredients. The component (a) is a film-forming agent which is an alkali-soluble resin exemplified by phenol novolac resins, cresol novolac resins and poly(hydroxystyrene) resins as well as derivatives thereof. The poly(hydroxystyrene) resins and derivatives thereof include homopolymers of a hydroxystyrene and copolymers of a hydroxystyrene and an acrylic acid derivative, acrylonitrile, methacrylonitrile, a methacrylic acid derivative, styrene or a derivative of styrene, e.g., α-methyl styrene, p-methyl styrene, o-methyl styrene, p-methoxy styrene and p-chlorostyrene, hydrogenated resins of a homopolymeric poly(hydroxystyrene) and hydrogenated resins of a copolymer of a hydroxystyrene and an acrylic acid derivative, methacrylic acid derivative or styrene derivative. Another class of preferable alkali-soluble resins includes poly (hydroxystyrene) substituted by alkali-solubility suppressing groups capable of being decomposed with an acid for a part of the hydrogen atoms in the hydroxy groups thereof.

The alkali-solubility suppressing groups capable of being decomposed with an acid above mentioned include tert-butyl, tert-butoxy carbonyl, tert-amyloxy carbonyl, 1-ethoxyethyl, 1-methoxypropyl, tetrahydropyranyl, tetrahydrofuranyl, benzyl and trimethylsilyl groups, though not particularly limitative, of which tert-butoxy carbonyl group is preferable in respect of the good balance between acid-decomposability and alkali-solubility suppressing activity and excellent cross sectional profile of the resist pattern. The substitution rate of the poly(hydroxystyrene) by the alkali-solubility suppressing groups capable of being decomposed with an acid is selected is in the range from 1 to 45% by moles or, preferably, from 5 to 15% by moles. When this substitution rate is too high, the alkali-solubility of the alkali-soluble resin is unduly decreased to cause a difficulty in the pattern formation due to incomplete removal of the resist layer in the development treatment on the unexposed areas.

Another class of poly(hydroxystyrene)-based resins suitable as the component (a) includes those in which a part of the hydroxy groups in a poly(hydroxystyrene) are replaced with sulfonate ester groups or carboxylate ester groups such as p-acetaminobenzene sulfonyl groups, benzene sulfonyl groups, p-chlorobenzene sulfonyl groups, naphthylbenzene sulfonyl groups, p-acetaminobenzene carbonyl groups, benzene carbonyl groups, p-chlorobenzene carbonyl groups, naphthyl-benzene carbonyl groups and the like. The substitution rate of the poly(hydroxystyrene) with these substituent groups is selected in the range from 0.5 to 50% by moles or, preferably, from 10 to 30% by moles. When this substitution rate is too high, the alkali-solubility of the alkali-soluble resin is unduly decreased to cause a difficulty in the pattern formation due to incomplete removal of the resist layer in the development treatment on the unexposed areas.

Among the above described various types, particularly preferable alkali-soluble resins as the component (a) include cresol novolac resins, poly(hydroxystyrene) resins and hydrogenated resins thereof, poly(hydroxystyrene) resins substituted by tert-butoxycarbonyl groups for from 1% to 45% of the hydroxy groups therein, and copolymers of a hydroxy-styrene and styrene and hydrogenated resins thereof. These alkali-soluble resins can be used either singly or as a combination of two kinds or more according to need.

The alkali-soluble resin as the component (a) in the inventive photoresist composition should preferably have a weight-average molecular weight in the range from 1000 to 30000 or, more preferably, from 2000 to 25000. An alkali-soluble resin having a too small average molecular weight causes a decrease in the residual-film ratio in the development treatment of a resist layer after pattern-wise exposure to actinic rays while a resin having a too large average molecular weight results in a decrease in the resolution of patterning.

The component (b) in the inventive photoresist composition is a compound capable of forming an acid by the irradiation with actinic rays and can be any of the acid-generating compounds used in conventional chemical-sensitization type negative-working photoresist compositions without particular limitations.

Examples of the compound suitable as the acid-generating agent in the inventive composition include: bis(sulfonyl) diazomethane compounds such as bis(p-toluenesulfonyl)-diazomethane, bis(1,1-dimethylethylsulfonyl) diazomethane, bis(cyclohexylsulfonyl)diazomethane, bis(2,4-dimethylphenyl-sulfonyl)diazomethane and the like; nitrobenzyl compounds such as 2-nitrobenzyl p-toluene sulfonate, 2,6-dinitrobenzyl p-toluene sulfonate and the like; sulfonate ester compounds such as pyrogallol trimesylate, pyrogallol tritosylate and the like; onium salts such as diphenyliodonium hexafluorophosphate, (4-methoxyphenyl)phenyliodonium trifluoromethane sulfonate, bis(p-tert-butylphenyl)iodonium trifluoromethane sulfonate, triphenylsulfonium hexafluorophosphate, (4methoxyphenyl)diphenylsulfonium trifluoromethane sulfonate, (p-tert-butylphenyl)diphenylsulfonium trifluoromethane sulfonate and the like; benzoin tosylate compounds such as benzoin tosylate, α-methylbenzoin tosylate and the like; and halogen-containing triazine compounds such as 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis (trichloromethyl)-1,3,5-triazine, 2-[2-(5-methyl-2-furyl) ethenyl]-4,6-bis(trichloromethyl)1,3,5-triazine, 2-[2-(3,5-dimethoxyphenyl)ethenyl]-4,6bis(trichloromethyl)-1,3,5-triazine, 2-[2-(3,4-dimethoxyphenyl)ethenyl]-4,6-bis (trichloromethyl)-1,3,5-triazine, 2(3,4-methylenedioxyphenyl)-4,6-bis(trichloromethyl)-1,3,5-triazine, 2,4,6-tris(1,3-dibromopropyl)-1,3,5-triazine, 2,4,6-tris(2,3-dibromopropyl)-1,3,5-triazine, tris(2,3dibromopropyl) isocyanurate and the like.

Among the above named acid-generating compounds, it is preferable that the component (b) is a halogen-containing triazine compound or, more preferably, a bromine-containing triazine compound or, most preferably, tris(2,3-dibromopropyl) isocyanurate in respect of the high sensitivity imparted to the inventive photoresist composition compounded therewith.

The component (c) in the inventive photoresist composition to serve as a crosslinking agent is selected from N-methylolated or N-alkoxymethylated melamine resins and urea resins as a known ingredient in the conventional chemical-sensitization type negative-working photoresist compositions. An N-methylolated melamine resin or urea resin can be prepared by the condensation reaction of melamine or urea with formaldehyde in boiling water and an N-alkoxymethylated melamine resin or urea resin can be prepared by the reaction of an N-methylolated melamine resin or urea resin with a lower alcohol. These resins can be used either singly or as a combination of two kinds or more according to need.

The amounts of the components (b) and (c) in the inventive photoresist composition are in the ranges from 0.5 to 20 parts by weight and from 3 to 70 parts by weight, respectively, per 100 parts by weight of the component (a). When the amount of the component (b) is too small, a decrease is caused in the sensitivity of the photoresist composition while, when the amount is too large, a photoresist composition in the form of a uniform solution cannot be obtained along with a decrease in the developability. When the amount of the component (c) is too small, a finely patterned resist layer cannot be obtained from the photoresist composition while, when the amount is too large, a photoresist composition in the form of a uniform solution cannot be obtained along with a decrease in the developability.

The component (d) as the fourth essential ingredient in the inventive photoresist composition is a sensitivity improver which is hexa(methoxymethyl) melamine, di(methoxymethyl) urea or a combination thereof. The amount of the component (d) is in the range from 5 to 40% by weight or, preferably, from 10 to 30% by weight based on the amount of the component (c). When the amount of the component (d) is too small, the desired improvements in the sensitivity and resolution cannot be fully accomplished while, when the amount thereof is too large, the stability of the resist layer after pattern-wise exposure to actinic rays or so-called post-exposure stability is decreased. It is known that a conventional negative-working photoresist composition has a problem that, while, when a resist layer of the composition is formed on the surface of a substrate and pattern-wise exposed to actinic rays followed by a post-exposure baking treatment and development treatment, a good patterned resist layer can be obtained provided that the post-exposure baking treatment immediately follows the pattern-wise exposure to actinic rays, a degradation is caused in the cross sectional profile of the patterned resist layer with rounded shoulders or trailing skirts when the post-exposure baking treatment is performed after lapse of a substantial length of time from the pattern-wise exposure. Namely, the inventive negative-working photoresist composition compounded with an appropriate amount of the component (d) is imparted with excellent post-exposure stability.

It is preferable in the formulation of the inventive photoresist composition that the component (d) is hexa(methoxymethyl) melamine when the component (c) is an N-substituted melamine resin and the component (d) is di(methoxymethyl) urea when the component (c) is an N-substituted urea resin. Particularly excellent sensitivity and resolution can be imparted to the photoresist composition by the use of a combination of a 95:5 to 60:40 by weight mixture of an N-substituted urea resin and di(methoxymethyl) urea and a 95:5 to 60:40 by weight mixture of an N-substituted melamine resin and hexa(methoxymethyl) melamine in a weight proportion in the range from 80:20 to 99:1.

In the following, the negative-working photoresist composition of the invention is described in more detail by way of examples.

Example 1

A negative-working photoresist solution was prepared by uniformly dissolving, in 140 g of ethyl lactate under agitation, 22.5 g of an alkali-soluble resin (VPS-2515, a product by Nippon Soda Co.) which was a copolymer of p-hydroxystyrene and styrene in a molar ratio of 85:15 and had a weight-average molecular weight of 2500, 2.0 g of a methylolated melamine resin and 0.4 g of hexa(methoxymethyl) melamine corresponding to 20% by weight of the melamine resin followed by the admixture of 2.0 g of tris(2,3-dibromopropyl) isocyanurate.

In the next place, a semiconductor silicon wafer of 6 inches diameter after a surface treatment by exposing for 7 minutes to an atmosphere of hexamethyl disilazane was coated with the above prepared photoresist solution on a spinner rotating at 3000 rpm for 30 seconds followed by drying for 90 seconds on a hot plate kept at 100° C. to form a photoresist layer having a thickness of 0.7 μm. The photoresist layer on the substrate surface was irradiated pattern-wise with an excimer laser beam on a minifying projection exposure machine (Model NSR-2005EX8A, manufactured by Nikon Co.) immediately followed by a post-exposure baking (PEB) treatment at 120° C. for 90 seconds and a development treatment in a 2.38% by weight aqueous solution of tetramethyl ammonium hydroxide using a puddle developing machine taking 65 seconds at 23° C. to give a patterned resist layer.

Good resolution could be obtained in the thus prepared pattern of the resist layer for a line-and-space pattern of 0.26 μm line width. The cross sectional profile of the patterned resist layer was excellently orthogonal standing upright on the substrate surface. The minimum exposure dose representing the sensitivity of the photoresist composition was 80 mJ/cm².

A further test was undertaken by repeating the same procedure as above except that the post-exposure baking treatment was performed not immediately after the pattern-wise exposure but after lapse of 70 minutes therefrom to find that the results were as satisfactory as in the former test.

Example 2

A negative-working photoresist solution was prepared by uniformly dissolving, in 140 g of ethyl lactate under agitation, 22.5 g of the same alkali-soluble resin as used in Example 1, 2.0 g of a methylolated urea resin and 0.44 g of di(methoxymethyl) urea corresponding to 22% by weight of the urea resin followed by the admixture of 2.0 g of tris(2,3-dibromopropyl) isocyanurate.

The thus prepared photoresist composition was subjected to the same evaluation test as in Example 1 to find that good resolution could be obtained in the pattern of the resist layer for a line-and-space pattern of 0.24 μm line width and the cross sectional profile of the patterned resist layer was excellently orthogonal on the substrate surface. The minimum exposure dose representing the sensitivity of the photoresist composition was 10 mJ/cm². A further test was undertaken by repeating the same procedure as above except that the post-exposure baking treatment was performed not immediately after the pattern-wise exposure but after lapse of 70 minutes therefrom to find that the results were as satisfactory as in the former test.

Example 3

A negative-working photoresist solution was prepared by uniformly dissolving, in 140 g of ethyl lactate under agitation, 22.5 g of the same alkali-soluble resin as used in Example 1, 0.08 g of a 81:19 by weight mixture of the same methylolated melamine resin as used in Example 1 and hexa(methoxymethyl) melamine and 2.25 g of a 79:21 by weight mixture of the same methylolated urea resin as used in Example 2 and di(methoxymethyl) urea followed by the admixture of 2.0 g of tris(2,3-dibromopropyl) isocyanurate.

The thus prepared photoresist composition was subjected to the same evaluation test as in Example 1 to find that good resolution could be obtained in the pattern of the resist layer for a line-and-space pattern of 0.22 μm line width and the cross sectional profile of the patterned resist layer was excellently orthogonal on the substrate surface. The minimum exposure dose representing the sensitivity of the photoresist composition was 30 mJ/cm². A further test was undertaken by repeating the same procedure as above except that the post-exposure baking treatment was performed not immediately after the pattern-wise exposure but after lapse of 70 minutes therefrom to find that the results were as satisfactory as in the former test.

Comparative Example 1

The experimental procedure was substantially the same as in Example 1 except that the amount of the hexa(methoxymethyl) melamine was decreased to 0.06 g corresponding to 3% by weight of the methylolated melamine resin to find that the resolution obtained here in the line-and-space pattern of the resist layer was 0.28 μm although the cross sectional profile of the patterned resist layer was orthogonal on the substrate surface. The minimum exposure dose representing the sensitivity of the photoresist composition was 170 mJ/cm². A further test was undertaken by repeating the same procedure as above except that the post-exposure baking treatment was performed not immediately after the pattern-wise exposure but after lapse of 70 minutes therefrom to find that the results were about the same as in the former test.

Comparative Example 2

The experimental procedure was substantially the same as in Example 2 except that the amount of the di(methoxymethyl) urea was decreased to 0.06 g corresponding to 3% by weight of the methylolated urea resin to find that the resolution obtained here in the line-and-space pattern of the resist layer was 0.28 μm although the cross sectional profile of the patterned resist layer was orthogonal on the substrate surface. The minimum exposure dose representing the sensitivity of the photoresist composition was 60 mJ/cm². A further test was undertaken by repeating the same procedure as above except that the post-exposure baking treatment was performed not immediately after the pattern-wise exposure but after lapse of 70 minutes therefrom to find that the results were about the same as in the former test.

Comparative Example 3

The experimental procedure was substantially the same as in Example 2 except that the amount of the methylolated urea resin was decreased to 1.6 g and the amount of the di(methoxymethyl) urea was increased to 0.8 g corresponding to 50% by weight of the methylolated urea resin to find that the resolution obtained here in the line-and-space pattern of the resist layer was 0.24 μm although the cross sectional profile of the patterned resist layer was orthogonal on the substrate surface. The minimum exposure dose representing the sensitivity of the photoresist composition was 20 mJ/cm². A further test was undertaken by repeating the same procedure as above except that the post-exposure baking treatment was performed not immediately after the pattern-wise exposure but after lapse of 70 minutes therefrom to find that the resolution was 0.30 μm and the cross sectional profile of the patterned resist layer was not orthogonal but had rounded shoulders and trailing skirts.

What is claimed is:

1. A negative-working photoresist composition which comprises, as a uniform blend:

(a) 100 parts by weight of an alkali-soluble resin which is a copolymer of hydroxystyrene and styrene;

(b) from 0.5 to 20 parts by weight of a compound capable of releasing an acid when irradiated with actinic rays;

(c) from 3 to 70 parts by weight of a crosslinking agent selected from the group consisting of melamine resins and urea resins substituted at the N-positions by methylol groups, alkoxymethyl groups or a combination thereof; and (d) a sensitivity improver selected from the group consisting of hexa(methoxymethyl) melamine and di(methoxymethyl) urea in an amount in the range from 5 to 40% by weight based on the amount of the component (c).

2. The negative-working photoresist composition as claimed in claim 1 in which the alkali-soluble resin as the component (a) has a weight-average molecular weight in the range from 1000 to 30000.

3. The negative-working photoresist composition as claimed in claim 1 in which the component (b) is a halogen-containing triazine compound.

4. The negative-working photoresist composition as claimed in claim 3 in which the halogen in the halogen-containing triazine compound is bromine.

5. The negative-working photoresist composition as claimed in claim 4 in which the bromine-containing triazine compound is tris(2,3-dibromopropyl) isocyanurate.

6. The negative-working photoresist composition as claimed in claim 1 in which the component (c) is a urea resin substituted at the N-positions by methylol groups, alkoxymethyl groups or a combination thereof and the component (d) is di(methoxymethyl) urea.

7. The negative-working photoresist composition as claimed in claim 1 in which the component (c) is a melamine resin substituted at the N-positions by methylol groups, alkoxymethyl groups or a combination thereof and the component (d) is hexa(methoxymethyl) melamine.

8. The negative-working photoresist composition as claimed in claim 1 in which the amount of the component (d) is in the range from 10 to 30% by weight based on the amount of the component (c).

9. The negative-working photoresist composition as claimed in claim 1 in which the component (c) is a combination of a melamine resin and a urea resin each substituted at the N-positions by methylol groups, alkoxymethyl groups or a combination thereof and the component (d) is a combination of hexa(methoxymethyl) melamine and di(methoxymethyl) urea in such a weight proportion that the weight ratio of the urea resin to the di(methoxymethyl) urea is in the range from 95:5 to 60:40, the weight ratio of the melamine resin to the hexa(methoxymethyl) melamine is in the range from 95:5 to 60:40 and the weight ratio of the total amount of the urea resin and di(methoxymethyl) urea to the total amount of the melamine resin and hexa(methoxymethyl) melamine is in the range from 80:20 to 99:1.

* * * * *